United States Patent [19]
Doke

[11] Patent Number: 5,576,512
[45] Date of Patent: Nov. 19, 1996

[54] THERMOELECTRIC APPARATUS FOR USE WITH MULTIPLE POWER SOURCES AND METHOD OF OPERATION

[75] Inventor: Michael J. Doke, Dallas, Tex.

[73] Assignee: Marlow Industries, Inc., Dallas, Tex.

[21] Appl. No.: 286,622

[22] Filed: Aug. 5, 1994

[51] Int. Cl.$^6$ .................................................. H01L 35/02
[52] U.S. Cl. ........................... 136/203; 136/224; 136/242; 62/3.2; 62/3.3; 62/3.7
[58] Field of Search ................................ 136/200, 203, 136/204, 224, 242; 62/3.2, 3.3, 3.61, 3.7

[56] References Cited

U.S. PATENT DOCUMENTS

| | | | |
|---|---|---|---|
| 2,837,899 | 6/1958 | Lindenblad | 62/1 |
| 2,872,788 | 2/1959 | Lindenblad | 62/3 |
| 2,932,953 | 4/1960 | Becket et al. | 62/3 |
| 3,048,020 | 8/1962 | Jones | 62/3 |
| 3,077,079 | 2/1963 | Pietsch | 62/3 |
| 3,177,670 | 4/1965 | Boehmer et al. | 62/3 |
| 3,177,671 | 4/1965 | Stumbaugh | 62/3 |
| 3,280,573 | 10/1966 | Brown et al. | 62/3 |
| 3,438,214 | 4/1969 | Schmittle | 62/3 |
| 3,487,201 | 12/1969 | Beranek | 219/494 |
| 3,632,451 | 1/1972 | Abbott | 136/203 |
| 3,823,567 | 7/1974 | Corini et al. | 62/3 |
| 4,007,600 | 2/1977 | Simms | 62/3 |
| 4,088,183 | 5/1978 | Anzai et al. | 165/104 S |
| 4,203,487 | 5/1980 | Gartner | 165/50 |
| 4,280,330 | 7/1981 | Harris et al. | 62/3 |
| 4,290,416 | 9/1981 | Maloney | 126/430 |
| 4,326,383 | 4/1982 | Reed et al. | 62/3 |
| 4,328,676 | 5/1982 | Reed | 62/3 |
| 4,346,562 | 8/1982 | Beitner | 62/3 |
| 4,368,416 | 1/1983 | James | 322/2 R |
| 4,472,945 | 9/1984 | Cech et al. | 62/3 |
| 4,570,679 | 2/1986 | Schippl | 138/149 |
| 4,609,036 | 9/1986 | Schrader | 165/10 |
| 4,620,897 | 11/1986 | Nakajima | 156/602 |
| 4,625,229 | 11/1986 | Maier | 357/81 |
| 4,644,753 | 2/1987 | Burke | 62/3 |
| 4,662,180 | 5/1987 | Menocal | 62/3 |
| 4,664,960 | 5/1987 | Ovshinsky | 428/98 |
| 4,677,416 | 6/1987 | Nishimoto et al. | 338/35 |
| 4,726,193 | 2/1988 | Burke et al. | 62/3 |
| 4,744,220 | 5/1988 | Kerner et al. | 62/3 |
| 4,833,888 | 5/1989 | Kerner et al. | 62/3.3 |

(List continued on next page.)

FOREIGN PATENT DOCUMENTS

| | | |
|---|---|---|
| 27976 | 1/1989 | Australia. |
| 1126180 | 6/1982 | Canada. |
| 0342165 | 11/1989 | European Pat. Off. . |
| 1125957 | 3/1962 | Germany. |
| 1198837 | 8/1965 | Germany ................................ 62/3.7 |
| 3-20580A | 1/1991 | Japan. |
| 8101739 | 6/1981 | WIPO. |
| 8504948 | 11/1985 | WIPO. |

OTHER PUBLICATIONS

"MOBICOOL Freshbag" product brochure, 4 pages, printed by TUV Product Service GS.
Marlow Industries, Inc. Product Brochure, "Thermoelectric Products" 31 pages, Copyright Nov. 1992.
"A New Scientific Development in Refrigeration" *Electric & Gas Technology, Inc.*, Apr. 6, 1993, 7 pages.

Primary Examiner—Charles T. Jordan
Assistant Examiner—Chrisman D. Carroll
Attorney, Agent, or Firm—Baker & Botts, L.L.P.

[57] ABSTRACT

A thermoelectric apparatus (10) is provided that is compatible with multiple power sources (12) each providing a different voltage. The present apparatus (10) includes a thermoelectric assembly (14) having a plurality of thermoelectric devices (18 & 20) and control circuitry (16) coupled between the thermoelectric assembly (14) and a power source (12). The control circuitry (16) can sense the voltage provided by the power source (12) and electrically configure the thermoelectric devices (18 & 20) in the thermoelectric assembly (14) between parallel and serial electrical configuration in response to the sensed voltage. The control circuitry (16) also couples the thermoelectric devices (18 & 20) to the power source (12).

32 Claims, 6 Drawing Sheets

U.S. PATENT DOCUMENTS

| | | | |
|---|---|---|---|
| 4,878,352 | 11/1989 | Weber et al. | 62/51.1 |
| 4,934,150 | 6/1990 | Fessler | 62/59 |
| 4,984,605 | 1/1991 | Schippl | 138/149 |
| 5,007,226 | 4/1991 | Nelson | 52/809 |
| 5,018,328 | 5/1991 | Cur et al. | 50/406 |
| 5,029,446 | 7/1991 | Suzuki | 62/3.6 |
| 5,082,335 | 1/1992 | Cur et al. | 312/401 |
| 5,090,981 | 2/1992 | Rusek, Jr. | 65/4.4 |
| 5,094,899 | 3/1992 | Rusek, Jr. | 428/69 |
| 5,157,893 | 10/1992 | Benson et al. | 52/792 |
| 5,168,339 | 12/1992 | Yokotani et al. | 257/64 |
| 5,209,069 | 5/1993 | Newnan | 62/3.64 |
| 5,252,408 | 10/1993 | Bridges et al. | 428/621 |
| 5,288,336 | 1/1994 | Strachan et al. | 136/200 |
| 5,330,816 | 7/1994 | Rusek, Jr. | 428/69 |
| 5,367,890 | 11/1994 | Doke | 62/3.7 |
| 5,371,665 | 12/1994 | Quisenberry et al. | 363/89 |

THERMOELECTRIC APPARATUS FOR USE WITH MULTIPLE POWER SOURCES AND METHOD OF OPERATION

TECHNICAL FIELD OF THE INVENTION

This invention relates in general to the field of thermoelectric systems, and more particularly to a thermoelectric apparatus for use with multiple power sources.

BACKGROUND OF THE INVENTION

The basic theory and operation of thermoelectric devices have been developed for many years. Thermoelectric devices may function as coolers and/or heaters. Thermoelectric devices are essentially small heat pumps that follow the laws of thermodynamics in the same way as mechanical heat pumps, refrigerators, or any other apparatus used to transfer heat energy. Thermoelectric devices, however, function with solid state electrical components as opposed to more traditional mechanical, fluid, heating and cooling components.

An assembly for a simple thermoelectric device generally includes two dissimilar materials such as N-type and P-type thermoelectric semiconductor elements. Heating and cooling with a thermoelectric device occurs by arranging the thermoelectric elements in an alternating N-element and P-element electrical configuration, with the thermoelectric elements electrically coupled in series and thermally in parallel. The Peltier effect occurs in the thermoelectric devices when a DC voltage applied to the N-type and P-type elements results in current flow through the serial electrical connection and heat transfer across the N-type and P-type elements in the parallel thermal connection. In a typical thermoelectric element array, the direction of net current flow through the thermoelectric elements determines the direction of heat transfer.

Previously developed thermoelectric systems are generally designed for use with a given power source, e.g., 12 volts or 24 volts. The number of thermoelectric elements within a thermoelectric device determines the operating voltage for the thermoelectric device. Therefore, previously developed thermoelectric systems are generally either 12 volt or 24 volt systems, and so long as the appropriate operating voltage is applied to the thermoelectric system, the desired heating or cooling is achieved.

Portable thermoelectric systems, such as portable coolers or heaters, have been previously developed for use in vehicles. These thermoelectric systems can generally be coupled directly to a vehicle's electrical system since most vehicle electrical systems typically provide a DC voltage. Currently, many vehicles have a 12 volt DC electrical system allowing for coupling a 12 volt thermoelectric system directly to the vehicle's electrical system.

A growing number of vehicles, particularly trucks in Europe and Asia, have 24 volt systems. Since many existing thermoelectric systems are compatible with only 12 volts, the 24 volts provided by these vehicle's electrical systems must be reduced to run a 12 volt thermoelectric system. Prior approaches to making a 12 volt thermoelectric system compatible with a 24 volt power source generally involve converting the 24 volts to 12 volts by DC to DC conversion. DC to DC conversion is often less than completely efficient and may result in voltage losses. For example, converting 24 volts to 12 volts may actually only provide 10 or 10.5 volts for a 12 volt thermoelectric system. Applying less than 12 volts to a 12 volt thermoelectric system may prevent the thermoelectric system from achieving designed cooling or heating capacity and may also damage the components within the thermoelectric system.

Another previously developed approach for providing a thermoelectric system compatible with multiple power sources has been to include multiple thermoelectric assemblies within the thermoelectric system with each assembly rated for a different operating voltage. In this way, for example, a thermoelectric system may include a 12 volt thermoelectric assembly and a 24 volt thermoelectric assembly. The appropriate thermoelectric assembly is activated based on the available operating voltage. Multiple thermoelectric assemblies in a thermoelectric system have disadvantages of adding additional expense to the thermoelectric system as well as requiring additional space.

Previously developed thermoelectric systems sometimes also implement inappropriate temperature regulating techniques. Previously developed systems may provide temperature regulation by turning a thermoelectric assembly on and off as predetermined temperatures are reached. This on and off approach to temperature regulation may result in undesired temperature cycling of the thermoelectric device. The different coefficients of thermal expansion for the materials in a thermoelectric device may cause thermally-induced mechanical stresses in the thermoelectric device when the device is temperature cycled. These stresses can damage the device. Therefore, excessive temperature cycling of a thermoelectric device may reduce its reliability and service life.

Previously developed thermoelectric systems also do not have a power saving operating mode. Previously developed thermoelectric systems are generally either on or off and do not provide for operating at less than full power. This may present a needless drain on the power source that diminishes its service life, particularly when the power source is a battery.

SUMMARY OF THE INVENTION

In accordance with the present invention, a thermoelectric apparatus is provided that substantially eliminates or reduces disadvantages and problems associated with previously developed thermoelectric systems. The present invention provides a thermoelectric apparatus having a single thermoelectric assembly that is compatible with multiple power sources.

One aspect of the present invention provides a thermoelectric apparatus compatible with multiple power sources each providing a different voltage. The present apparatus includes a thermoelectric assembly having a plurality of thermoelectric devices and control circuitry coupled between the thermoelectric assembly and a power source. The control circuitry can sense the voltage provided by the power source and alternately electrically configure the thermoelectric devices in the thermoelectric assembly in parallel or serial electrical configuration in response to the voltage sensed from the power source. The control circuitry also couples the thermoelectric devices to the power source with the appropriate serial or parallel electrical configuration.

Another aspect of the present invention provides a method for operating a thermoelectric apparatus having a plurality of thermoelectric devices with multiple power sources each providing a different voltage. The method includes coupling the thermoelectric assembly to a power source providing a voltage and sensing the voltage provided by the power source. The method further includes generating a control signal in response to the voltage sensed from the power source. The thermoelectric devices in the thermoelectric assembly are electrically configured in either a parallel or serial electrical configuration in response to the control signal depending on the amount of voltage provided by the power source.

Yet another aspect of the present invention provides a thermoelectric device for heating and cooling a load compatible with multiple power sources. The device includes a container for housing the load and a thermoelectric assembly having a plurality of thermoelectric devices. The device also includes control circuitry coupled between the thermoelectric assembly and a power source for sensing the voltage provided by the power source. The control circuitry electrically configures the thermoelectric devices in the thermoelectric assembly in the desired parallel or serial electrical configuration depending on the voltage provided by the power source. The control circuitry also couples the electrically configured thermoelectric devices electrically to the power source.

One of the technical advantages of the present invention may include a thermoelectric apparatus that operates at multiple operating voltages. A thermoelectric apparatus incorporating one embodiment of this present invention can be used directly with either a 12 volt or 24 volt power source.

Another technical advantage of the present invention includes a single thermoelectric assembly for heating and/or cooling when supplied with multiple operating voltages. This makes the present invention less expensive and smaller than previously developed thermoelectric systems that use a separate thermoelectric assembly for each operating voltage.

The present invention eliminates the need for DC to DC conversion and, therefore, does not suffer the inefficiencies or possible loss associated with DC conversion.

Another technical advantage of the present invention includes the ability to automatically sense a supply voltage and electrically configure the thermoelectric apparatus for proper operation.

Yet another technical advantage of the present invention is the ability to provide temperature control for a thermoelectric apparatus along with power regulating and power saving capabilities. The present invention also provides increased reliability by eliminating undesired temperature cycling of the thermoelectric apparatus when providing temperature regulation.

BRIEF DESCRIPTION OF THE DRAWINGS

For a more complete understanding of the present invention and advantages thereof, reference is now made to the following written description taken in conjunction with the accompanying drawings in which like reference numbers indicate like features, and wherein.

DETAILED DESCRIPTION OF THE INVENTION

Preferred embodiments of the present invention and its advantages are best understood by referring to FIGS. 1–8, like numerals being used for like and corresponding parts of the various drawings.

Figure 1:
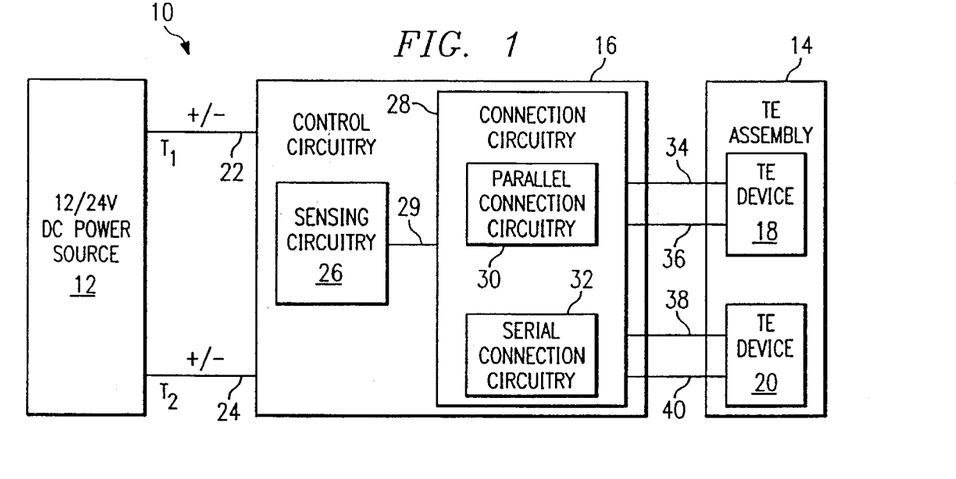
FIG. 1 shows a block diagram of one embodiment for the present thermoelectric apparatus.

FIG. 1 shows an embodiment of the present invention in block diagram form. Thermoelectric apparatus 10 includes thermoelectric (TE) assembly 14 and control circuitry 16. Power source 12 may be connected to thermoelectric apparatus 10 by control circuitry 16. Thermoelectric assembly 14 in FIG. 1 includes thermoelectric device 18 and thermoelectric device 20. The number of thermoelectric devices in thermoelectric assembly 14 may be varied from that shown in FIG. 1 without departing from the inventive concepts of the present invention.

Control circuitry 16 of thermoelectric apparatus 10 in FIG. 1 may be coupled to power source 12 by power lines $T_1$ 22 and $T_2$ 24. Power source 12 represents the various operating voltages that may be accommodated with thermoelectric apparatus 10. For the remainder of this disclosure, power source 12 will be described as providing a 12 volt or 24 volt operating voltage. The present invention is not limited to only these voltages and allows a wide range of DC power supplies to be satisfactorily used with thermoelectric apparatus 10. An example of power source 12 would be a vehicle's electrical system.

Control circuitry 16 includes sensing circuitry 26 for sensing the power provided by power source 12. In some embodiments of the present invention with power source 12 providing a constant 12 volts, sensing circuitry 26 can also sense the temperature at select locations within thermoelectric apparatus 10 and control the temperature of apparatus 10 as desired. With power source 12 providing a constant 12 volts, sensing circuitry 26 can also initiate power savings in thermoelectric apparatus 10.

Control circuitry 16 also includes connection circuitry 28 coupled to sensing circuitry 26 by control signal 29. Connection circuitry 28 includes parallel connection circuitry 30 and serial connection circuitry 32. Parallel connection circuitry 30 electrically configures control circuitry 16 so that thermoelectric devices 18 and 20 in thermoelectric assembly 14 are connected in parallel to power source 12. Serial connection circuitry 32 electrically configures thermoelectric devices 18 and 20 so that they are connected in series to power source 12.

Control circuitry 16 may be selectively coupled to thermoelectric assembly 14 by power leads 34, 36, 38 and 40. Control circuitry 16 provides the operating voltage from power source 12 to thermoelectric assembly 14 by these power leads.

In operation of thermoelectric apparatus 10 of FIG. 1, sensing circuit 26 of control circuitry 16 preferably ascertains the operating voltage provided by power source 12 across leads $T_1$ 22 and $T_2$ 24, regardless of which lead is positive and which is ground. Sensing circuitry 26 provides control signal 29 to connection circuitry 28 responsive to the voltage sensed on $T_1$ 22 and $T_2$ 24. Connection circuitry 28 responds to control signal 29 by electrically configuring thermoelectric devices 18 and 20 for the desired mode of operation. When sensing circuit 26 determines that power source 12 is providing 12 volts, then parallel connection circuitry 30 in connection circuitry 28 couples thermoelectric devices 18 and 20 to power source 12 in parallel. For example, when power source 12 provides +12 volts on $T_1$ 22, then connection circuitry 30 couples the +12 volts to thermoelectric device 18 on lead 34 and lead 36 is grounded. In a similar manner, thermoelectric device 20 is provided +12 volts on lead 38 and lead 40 is grounded. When +12 volts is supplied on $T_1$ 22 and $T_2$ 24 is grounded, control circuitry 16 electrically configures thermoelectric devices 18 and 20 in parallel for operation with the +12 volts. Thermoelectric apparatus 10 may therefore be referred to as bipolar since it will operate satisfactorily with power source 12 regardless of the polarity of the operating voltage provided by power source 12.

Should sensing circuitry 26 determine that power source 12 supplies 24 volts across $T_1$ 22 and $T_2$ 24, then control signal 29 will cause serial connection circuitry 32 in connection circuitry 28 to electrically configure thermoelectric devices 18 and 20 in series. For example, when power source 12 provides +24 volts on $T_1$ 22, then connection circuitry provides thermoelectric assembly 14 +24 volts on lead 34 and lead 40 is grounded. Leads 36 and 38 are coupled to one another within connection circuitry 28 to complete the serial connection of thermoelectric devices 18 and 20 to power source 12. Electrically configuring thermoelectric devices 18 and 20 in series increases the effective load capacity of thermoelectric assembly 14. This allows thermoelectric assembly 14 to provide either heating and cooling with the higher 24 volt operating voltage. In a similar manner, when +24 volts is supplied to $T_2$ 24 and $T_1$ 22 is grounded, control circuitry 16 electrically configures thermoelectric devices 18 and 20 in a serial electrical configuration for operation with 24 volts.

In summary, parallel connection circuitry 30 responds to control signal 29 from sensing circuitry 26 indicating a 12 volt power source 12 by connecting thermoelectric devices 18 and 20 in parallel to power source 12. Serial connection circuitry 32 responds to control signal 29 from sensing circuitry 26 indicating a 24 volt power source 12 by connecting thermoelectric devices 18 and 20 in series to power source 12.

Sensing circuitry 26 may also include sensors for measuring the temperature within thermoelectric apparatus 10 at selected locations. With the voltage to thermoelectric assembly 14 held constant, switching from parallel to serial electrical configuration within thermoelectric assembly 14 increases the effective load of thermoelectric assembly 14, and, therefore, reduces the current in assembly 14. Reducing the current in assembly 14 decreases the rate of cooling or heating by the thermoelectric elements in thermoelectric devices 18 and 20 when the voltage across thermoelectric assembly 14 is held constant. Sensing circuitry 26 can respond to a temperature measurement and provide control signal 29 to connection circuitry 28 so that thermoelectric devices 18 and 20 are switched between full cooling or heating (parallel electrical configuration) and half cooling or heating (serial electrical configuration). In this way, when the temperature in apparatus 10 reaches a predetermined level, a parallel electrical configuration of thermoelectric devices 18 and 20 can be switched to a serial electrical configuration. The serial electrical configuration of thermoelectric devices 18 and 20 provides less heating or cooling than the parallel electrical configuration. Once the temperature changes a predetermined amount from the set temperature, the electrical configuration of thermoelectric devices 18 and 20 can be switched back to a parallel electrical configuration to provide full cooling or heating so that the temperature is appropriately regulated. By this way, temperature regulation of thermoelectric apparatus 10 may be achieved.

Control circuitry 16 may also include the ability to achieve power savings for thermoelectric apparatus 10 when the thermoelectric apparatus is operated with a 12 volt power source. As previously described, when thermoelectric devices 18 and 20 are coupled in parallel, thermoelectric assembly 14 draws more current from power source 12 than when thermoelectric devices 18 and 20 are coupled in series assuming a constant voltage supply. Thermoelectric assembly 14, therefore, drains more power from power source 12 when in a parallel electrical configuration then in a serial electrical configuration. Control circuitry 16 can switch thermoelectric devices 18 and 20 between their parallel and serial electrical configuration in order to achieve power savings in thermoelectric apparatus 10.

Figure 2:
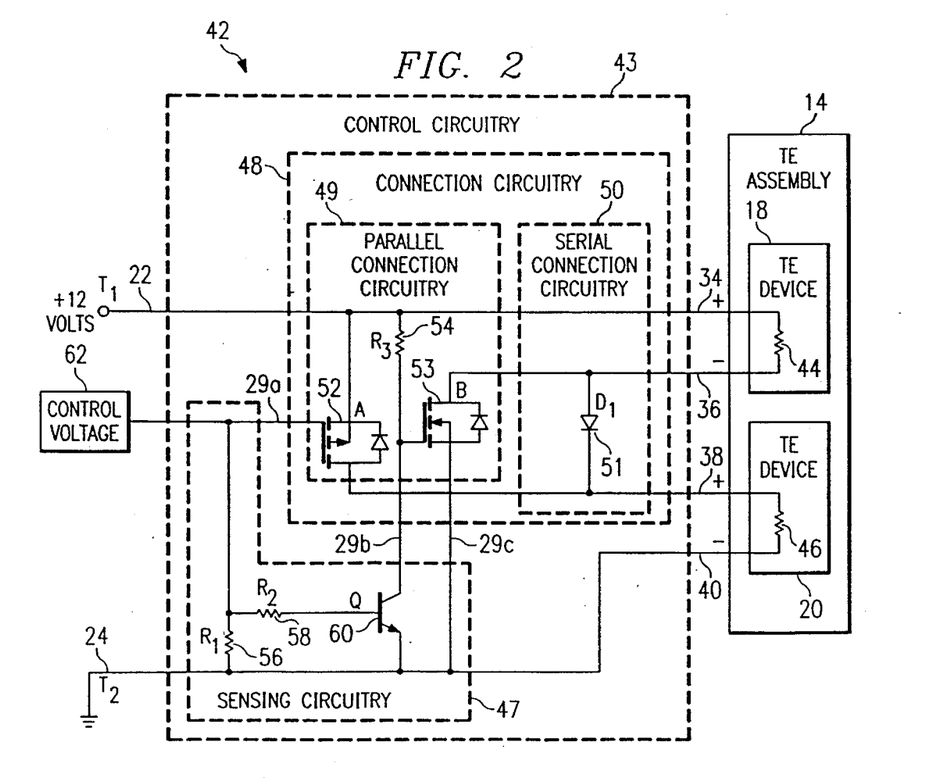
FIG. 2 illustrates a circuit schematic for a thermoelectric system incorporating an embodiment of the present invention providing unipolar series-parallel power source switching.

FIG. 2 is a circuit schematic for an embodiment of the present invention. Thermoelectric apparatus 42 in FIG. 2 includes thermoelectric assembly 14 coupled to control circuitry 16, with control circuitry 43 coupled to power source 12 (not explicitly shown) as represented by $T_1$ 22 and $T_2$ 24. FIG. 2 provides additional detail on an embodiment of the present invention. Each thermoelectric device of thermoelectric assembly 14 includes a plurality of thermoelectric elements. Thermoelectric elements of thermoelectric device 18 are represented by load 44, and the thermoelectric elements of thermoelectric device 20 are represented by load 46. The number of thermoelectric elements within either thermoelectric device 18 or 20 may be varied without departing from the inventive concepts of the present invention.

Control circuitry 43 of thermoelectric apparatus 42 includes sensing circuitry 47 and connection circuitry 48. Connection circuitry 48 includes parallel connection circuitry 49 and serial connection circuitry 50. Serial connection circuitry 50 includes diode $D_1$ 51 that provides a serial path between thermoelectric device 18 and thermoelectric device 20 by leads 36 and 38, respectively, when conducting. The rating of $D_1$ 51 is chosen so that it conducts only when the voltage across it goes above the voltage level where a serial electrical configuration for thermoelectric devices 18 and 20 is desired.

Parallel connection circuitry 49 includes switch A 52 coupled in parallel with switch B 53. Switch A 52 and switch B 53 may be embodied in mechanical or solid state switches. In one embodiment of parallel connection circuitry 49, switch A 52 is embodied in a P-channel Metal Oxide Semiconductor Field Effect Transistor (MOSFET), part number IRFR9020, and switch B 53 is embodied in an N-channel MOSFET, part number IRFR020, both available from International Rectifier. Bipolar transistors may also be used for switch A 52 and B 53 without departing from the inventive concepts of the present invention. For the remaining discussions of the present invention, switch A 52 and B 53 will be referred to as MOSFET A 52 and B 53, respectively, it being understood that other forms of switch A 52 and B 53 may be used without departing from the concepts of the present invention.

Resistor $R_3$ 54 of parallel connection circuitry 49 provides current limiting to the gate of MOSFET B 53. The gate of MOSFET A 52 receives control signal 29a from sensing circuitry 47, the drain is coupled to $T_1$ 22, and the source is coupled to lead 38 of thermoelectric assembly 14. For MOSFET B 53, the gate is coupled to $T_1$ 22 through current limiting resistor $R_3$ 54 and to control signal 29b from sensing circuitry 49. The source of MOSFET B 53 is coupled to control signal 29c from sensing circuitry 47 and to ground $T_2$ 24.

Sensing circuitry 47 includes resistor $R_1$ 56 coupled in parallel with a serial combination of resistor $R_2$ 58 and switch Q 60 between $T_2$ 24 and control voltage 62. Resistors $R_1$ 56 and $R_2$ 58 provide current limiting for switch Q 60 so that it is not damaged. Switch Q 60 may be embodied in any generally available bipolar transistor having a rating comparable to the voltage and currents of thermoelectric apparatus 42. For the remaining discussions, switch Q 60 will be referred to as transistor Q 60, it being understood that other forms for switch Q 60 may be used without departing from the concepts of the present invention. The base of transistor Q 60 is coupled to control voltage 62 through resistor $R_2$ 58. The collector of transistor Q 60 provides control signal 29b, and the emitter is coupled to $T_2$ 24. Sensing circuitry 47 also includes an input for control voltage 62. Sensing circuitry 47 provides control signals 29a, 29b, and 29c to connection circuitry 48.

In operation of thermoelectric apparatus 42 of FIG. 2, when +12 volts is supplied on $T_1$ 22 and $T_2$ 24 is grounded, the electrical configuration of thermoelectric devices 18 and 20 in thermoelectric assembly 14 may be controlled by control voltage 62. When control voltage 62 is set to +12 volts then control signal 29a from sensing circuitry 47 is at +12 volts. Supplying +12 volts to the MOSFET A 52 turns it off. Additionally, with control voltage 62 at +12 volts, the base of transistor Q 60 is high turning it on. Turning transistor Q 60 on pulls the gate of MOSFET B 53 low to ground at $T_2$ 24 turning MOSFET B 53 off.

With MOSFETS A 52 and B 53 off, the +12 volts on $T_1$ 22 are provided to thermoelectric device 18 by lead 34. With MOSFET B 53 off, the voltage across $D_1$ 51 rises until $D_1$ 51 turns on and conducts. The current out of thermoelectric device 18 on lead 36 travels through conducting diode $D_1$ 51 to lead 38, through thermoelectric device 20, and down to $T_2$ 24 on lead 40 completing the flow of current in thermoelectric apparatus 42. In this way, when control voltage 62 to sensing circuitry 47 is at +12 volts, thermoelectric assembly 14 is electrically configured for serial connection of thermoelectric devices 18 and 20.

To achieve a parallel electrical configuration for thermoelectric devices 18 and 20, control voltage 62 is set to ground. Setting control voltage 62 to ground makes control signal 29a to MOSFET A 52 low. With control signal 29a low, MOSFET A 52 turns on and conducts. With control signal 62 at ground, the base of transistor Q 60 is low, turning transistor Q 60 off. This allows the gate of MOSFET B 53 to be pulled high to $T_1$ 22, thereby turning MOSFET B 53 on. With MOSFET A 52 on and MOSFET B 53 on, thermoelectric devices 18 and 20 are connected in parallel.

Current provided by $T_1$ 22 is conducted through MOSFET A 52 to lead 38 of thermoelectric device 20, through thermoelectric device 20, and to ground at $T_2$ 24 by lead 40. In a similar manner, current is conducted by lead 34 into thermoelectric device 18, exits on lead 36, conducts through on MOSFET B 53, and to ground at $T_2$ 24. In this way, with MOSFET A 52 and MOSFET B 53 on, thermoelectric devices 18 and 20 of thermoelectric assembly 14 are in a parallel electrical configuration. It is noted that thermoelectric apparatus 42 of FIG. 2 is unipolar as it will only operate with $T_1$ 22 connected to the positive voltage and $T_2$ 24 grounded.

Figure 3:
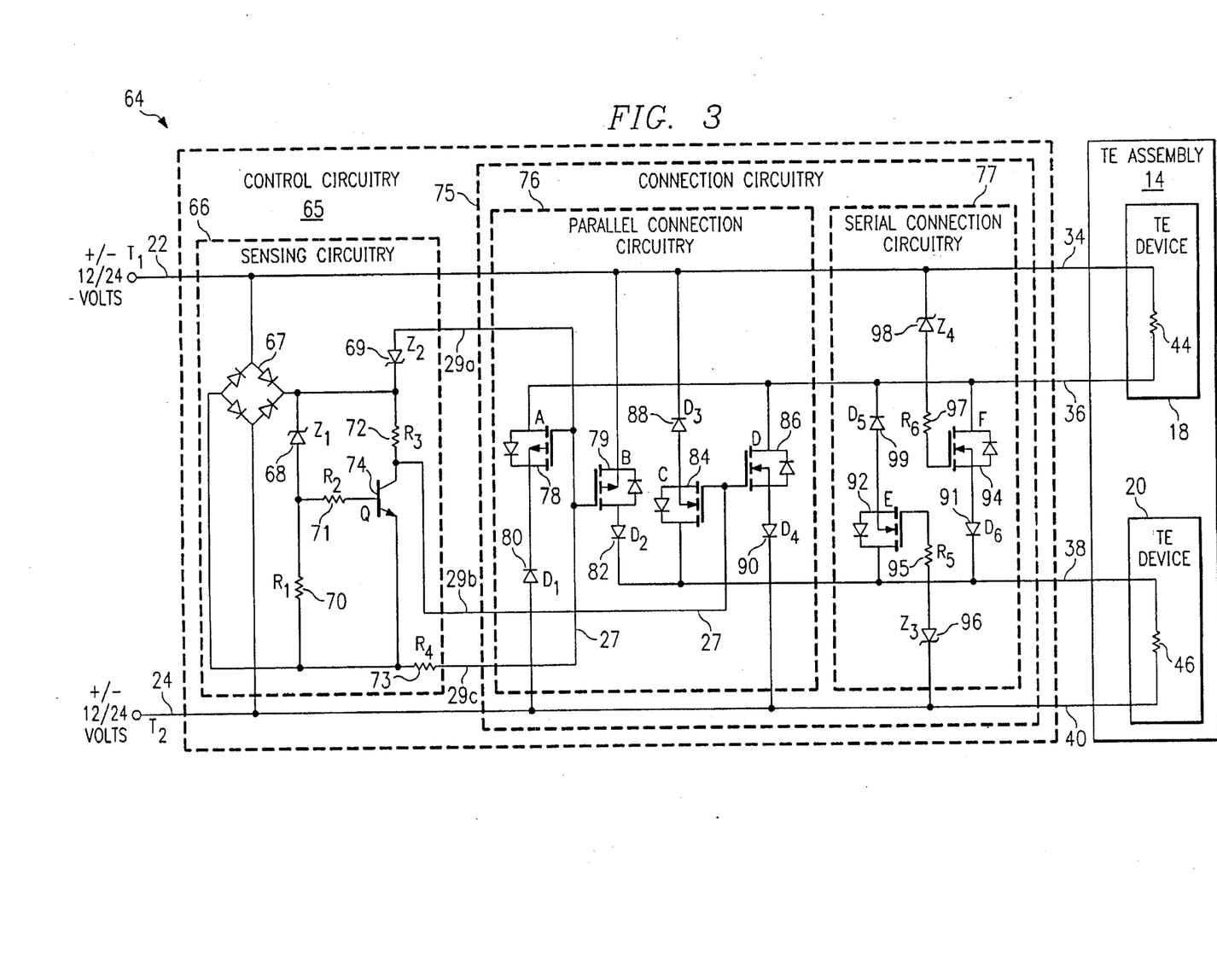
FIG. 3 shows a circuit schematic for a thermoelectric apparatus incorporating an embodiment of the present invention having bipolar power source sensing circuitry.

FIG. 3 shows a circuit schematic for an embodiment of the present invention with bipolar supply voltage sensing capability. Thermoelectric apparatus 64 of FIG. 3 includes thermoelectric assembly 14 coupled to control circuitry 65. Control circuitry 65 is coupled to power source 12 (not explicitly shown) by leads $T_1$ 22 and $T_2$ 24.

Control circuitry 65 for apparatus 64 of FIG. 3 includes sensing circuitry 66 having rectifier bridge 67 coupled across $T_1$ 22 and $T_2$ 24 so that sensing circuitry 66 can sense the voltage across $T_1$ 22 and $T_2$ 24 regardless of the voltage's polarity. Sensing circuitry 66 also includes zener diodes $Z_1$ 68 and $Z_2$ 69. Zener diode $Z_1$ 68 is coupled to rectifier bridge 67 and to resistors $R_1$ 70 and $R_2$ 71. The ratings of zener diodes $Z_1$ 68 and $Z_2$ 69 are chosen to set the voltage level where thermoelectric devices 18 and 20 in a parallel electrical configuration are disconnected from $T_1$ 22 and $T_2$ 24. The anode of $Z_2$ 69 provides control signal 29a from sensing circuitry 66. Sensing circuitry 66 also includes switch Q 74 that may be embodied in a generally available transistor rated for the currents and voltages of apparatus 64. For the remaining discussions, switch Q 74 will be referred to as transistor Q 74, it being understood that other embodiments for switch Q 74 may be used without departing from the inventive concepts of the present invention. Resistors $R_1$ 70 and $R_2$ 71 provide current limiting for NPN transistor Q 74 with resistor $R_2$ 71 coupled to the base of transistor Q 74. The collector of transistor Q 74 is coupled to the cathode of zener diode $Z_2$ 69 through resistor $R_3$ 72, the cathode of zener diode $Z_1$ 68, and to rectifier bridge 67. The collector of transistor Q 74 also provides control signal 29b from sensing circuitry 66. The emitter of transistor Q 74 is coupled to bridge rectifier 67 and also provides control signal 29c from sensing circuitry 66 through resistor $R_4$ 73.

Control circuitry 65 of thermoelectric apparatus 64 of FIG. 3 also includes connection circuitry 75 having parallel connection circuitry 76 and serial connection circuitry 77. The embodiment of parallel connection circuitry 76 shown in FIG. 3 includes switch A 78 and switch B 79 coupled in parallel between $T_1$ 22 and $T_2$ 24. Switches A 78 and B 79 may be P-channel MOSFETS, and the remaining discussion on parallel connection circuitry 76 will refer to switches A 78 and B 79 as MOSFETS. The gates of MOSFET A 78 and MOSFET B 79 are coupled to control signal 29a and 29c from sensing circuitry 66. The source of MOSFET A 78 is coupled to lead 36 of thermoelectric device 18, and the drain of MOSFET A 78 is coupled to $T_2$ 24 through diode $D_1$ 80. The drain of MOSFET B 79 is coupled to $T_1$ 22, and the source of MOSFET B 79 is coupled to lead 38 of thermoelectric device 20 through diode $D_2$ 82. Diodes $D_1$ 80 and $D_2$ 82 protect MOSFETS A 78 and B 79, respectively. P-channel MOSFETS A 78 and B 79 may be embodied in International Rectifier part number IRFR9020.

Parallel connection circuitry 76 of FIG. 3 also includes switch C 84 and switch D 86 coupled in parallel between $T_1$ 22 and $T_2$ 24. Switches C 84 and D 86 may be N-channel MOSFETS, and the remaining discussion on parallel connection circuitry 76 will refer to switches C 84 and D 86 as MOSFETS. The gates of MOSFETS C 84 and D 86 are coupled to control signal 29b from sensing circuitry 66. The drain of MOSFET C 84 is coupled to lead 38 of thermoelectric device 20, and the source of MOSFET C 84 is coupled to $T_1$ 22 through diode $D_3$ 88. The drain of MOSFET D 86 is coupled to lead 36 of thermoelectric device 18, and the source of MOSFET D 86 is coupled to $T_2$ 24 through $D_4$ 94. Diodes $D_3$ 88 and $D_4$ 90 protect MOSFETS C 84 and D 86, respectively. N-channel MOSFETS C 84 and D 86 may be embodied in International Rectifier part number IRFR020.

In the embodiment of thermoelectric apparatus 64 of FIG. 3, serial connection circuitry 77 includes switch E 92 and switch F 94 coupled in parallel between thermoelectric devices 18 and 20. Switches E 92 and F 94 may be embodied N-channel MOSFETS, and the remaining discussions on serial connection circuitry 77 will refer to switches E 92 and F 94 as MOSFETS. The gate of MOSFET E 92 is coupled to $T_2$ 24 through the serial combination of resistor $R_5$ 95 and zener diode $Z_3$ 96. The drain of MOSFET E 92 is coupled to lead 38 of thermoelectric device 20, and the source of MOSFET E 92 is coupled to lead 36 of thermoelectric device 18 through diode $D_5$ 99. The gate of MOSFET F 94 is coupled to $T_1$ 22 through the serial combination of resistor $R_6$ 97 and zener diode $Z_4$ 98. The drain of MOSFET F 94 is coupled to lead 36 of the thermoelectric device 18 through diode $D_6$ 91, and the source of MOSFET F 94 is coupled to lead 38 of thermoelectric device 20. Diodes $D_5$ 99 and $D_6$ 91 may be used to protect MOSFETS E 92 and F 94 respectively, as connection circuitry 95 switch between serial and parallel electrical configuration. MOSFETS E 92 and F 94 may be embodied in International Rectifier part number IRFR020.

Zener diode $Z_3$ 96 protects MOSFET E 92, and zener diode $Z_4$ 98 protects MOSFET E 94. The ratings of zener diodes $Z_3$ 96 and $Z_4$ 98 should be chosen so that the diodes conduct at the voltage level where a serial electrical configuration of thermoelectric devices 18 and 20 are desired. For a thermoelectric apparatus compatible with both a 12 volt and 24 volt operating voltage, $Z_3$ 96 and $Z_4$ 98 may be, for example, zener diodes rated at 20 volts.

In operation of thermoelectric apparatus 64 of FIG. 3, power source 12 may have multiple operating voltages or may be several different power sources, each with a different operating voltage. Additionally, control circuitry 65 is bipolar so the positive voltage may be applied to either $T_1$ 22 or $T_2$ 24. The remainder of the description of the operation of thermoelectric apparatus 64 will be assuming that power source 12 is either a 12 volt or 24 volt power source. In this example, the ratings of zener diodes $Z_1$ 68 and $Z_2$ 69 will be chosen to turn on above 12 volts, for example, at 15 volts.

With power source 12 providing +12 volts across $T_1$ 22 and $T_2$ 24 grounded, and with $Z_1$ 68 and $Z_2$ 69 rated above 12 volts, the zener diodes do not conduct. This makes the base of transistor Q 74 low so transistor Q 74 remains off. With $Z_2$ 69 not conducting, control signal 29a to the gates of both MOSFETS A 78 and B 79 of parallel connection circuitry 75 is low. This turns both MOSFETS A 78 and B 79 on. With transistor Q 74 off, control signals 29b and 29c to the gates of MOSFETS C 84 and D 86 are high, turning both MOSFETS C 84 and D 86 on.

In this state +12 volts provided on $T_1$ 22, provides current across $T_1$ 22 to thermoelectric device 18. It is noted that the current will not enter serial connection circuitry 32 through $Z_4$ 98 if the $Z_4$ 98 is chosen to have an activation level above 12 volts. Current enters thermoelectric device 18 at lead 34 and exits by lead 36. With no current being conducted through $Z_4$ 98, MOSFET F 94 is off. As previously noted, with +12 volts on $T_1$ 22, MOSFET D 86 is on and provides the current from lead 36 of thermoelectric device 20 to ground $T_2$ 24. By this way, current is conducted across $T_1$ 22, through thermoelectric device 18, down through MOSFET D 86, and returns to ground at $T_2$ 24.

Continuing in this example with +12 volts on $T_1$ 22 and $T_2$ 24 grounded, thermoelectric device 20 of thermoelectric apparatus 14 receives the current on $T_1$ 22 through MOSFET B 78 that is on. Current enters device 20 through lead 38, exits by lead 40, and returns to ground on $T_2$ 24.

Reversing the polarity of the voltages on $T_1$ 22 and $T_2$ 24 does not affect the function of thermoelectric apparatus 64 of FIG. 3. When +12 volts are provided on $T_2$ 24, sensing circuit 66 turns the appropriate MOSFETS in parallel connection circuitry 76 on so that thermoelectric device 18 and thermoelectric device 20 are coupled in parallel. For example, with +12 volts applied to $T_2$ 24 and $T_1$ 22 grounded, current is conducted from $T_2$ 24 to thermoelectric device 18 through MOSFET A 76. In a similar manner, MOSFET C 84 returns current from thermoelectric device 20 to ground on $T_1$ 22. Rectifier bridge 67 of sensing circuitry 66 allows sensing circuitry 66 to be bipolar, i.e., applying the positive voltage on either $T_1$ 22 or $T_2$ 24 does not affect the operation of sensing circuitry 26 or the output of control signals 29a–29c.

When the voltage supplied by power source 12 is raised, for example, to the 24 volts available with some vehicle electrical systems, then control circuitry 65 electrically configures thermoelectric devices 18 and 20 into a series electrical configuration with connection circuitry 75. This increases the effective load of thermoelectric assembly 14 so that the higher voltage and current can be accommodated.

Once the voltage across $T_1$ 22 or $T_2$ 24 goes above the ratings for $Z_1$ 68 and $Z_2$ 69 of sensing circuitry 66, then MOSFETS A 78, B 79, C 84, and D 86 in parallel connection circuitry 76 are turned off. Once $Z_2$ 69 turns on, control signal 29a to the gates of MOSFETS A 78 and B 79 is high, turning both MOSFETS off. Similarly, when the input voltage on $T_1$ 22 or $T_2$ 24 exceeds the rating of $Z_1$ 68, it turns on and conducts turning transistor Q 74 on. With transistor Q 74 on, control signal 29b to the gates of MOSFETS C 84 and D 86 is low, turning both MOSFETS off. Therefore, once the voltage across $T_1$ 22 or $T_2$ 24 goes above the ratings of $Z_1$ 68 and $Z_2$ 69, parallel connection circuitry 76 is turned off preventing current from being conducted to thermoelectric assembly 14.

As the voltage across $T_1$ 22 increases serial connection circuitry 77 turns on. $Z_3$ 96 or $Z_4$ 98 will turn on depending on the polarity of the voltage on $T_1$ 22 and $T_2$ 24. When $Z_4$ 98 turns on and conducts, the gate of MOSFET F 94 is taken high causing MOSFET F 94 to turn on. This creates a serial path between thermoelectric devices 18 and 20. In a similar manner, when $Z_3$ 96 turns on and conducts, the gate of MOSFET E 92 goes high, turning MOSFET E on. This also creates a serial path between thermoelectric devices 20 and 18. Therefore, as the operating voltage of power source 12 increases or is switched to a higher value, sensing circuitry 66 detects the increase or new input voltage and causes connection circuitry 75 to switch the electrical configuration of thermoelectric devices 18 and 20 from parallel to serial connection.

Control circuitry 65 of thermoelectric apparatus 64 of FIG. 3 automatically senses the voltage provided by power source 12 and automatically electrically configures thermoelectric assembly 14 for either serial or parallel electrical configuration. Control circuitry 65 accomplishes the switching within thermoelectric assembly 14 regardless of whether the positive voltage is provided on $T_1$ 22 or $T_2$ 24. It is noted that it may be desirable to have a gap between the ratings of zener diodes in sensing circuitry 66 and the zener diodes in serial connection circuitry 77. For example, for a 12 volt/24 volt power source, providing $Z_1$ 68 and $Z_2$ 69 rated at 15 volts and $Z_3$ 96 and $Z_4$ 98 rated at 20 volts, provides a gap where neither parallel connection circuitry 76 or serial connection circuitry 77 is active. This prevents parallel connection circuitry 76 and serial connection circuitry 77 from both being active simultaneously.

Figure 4:
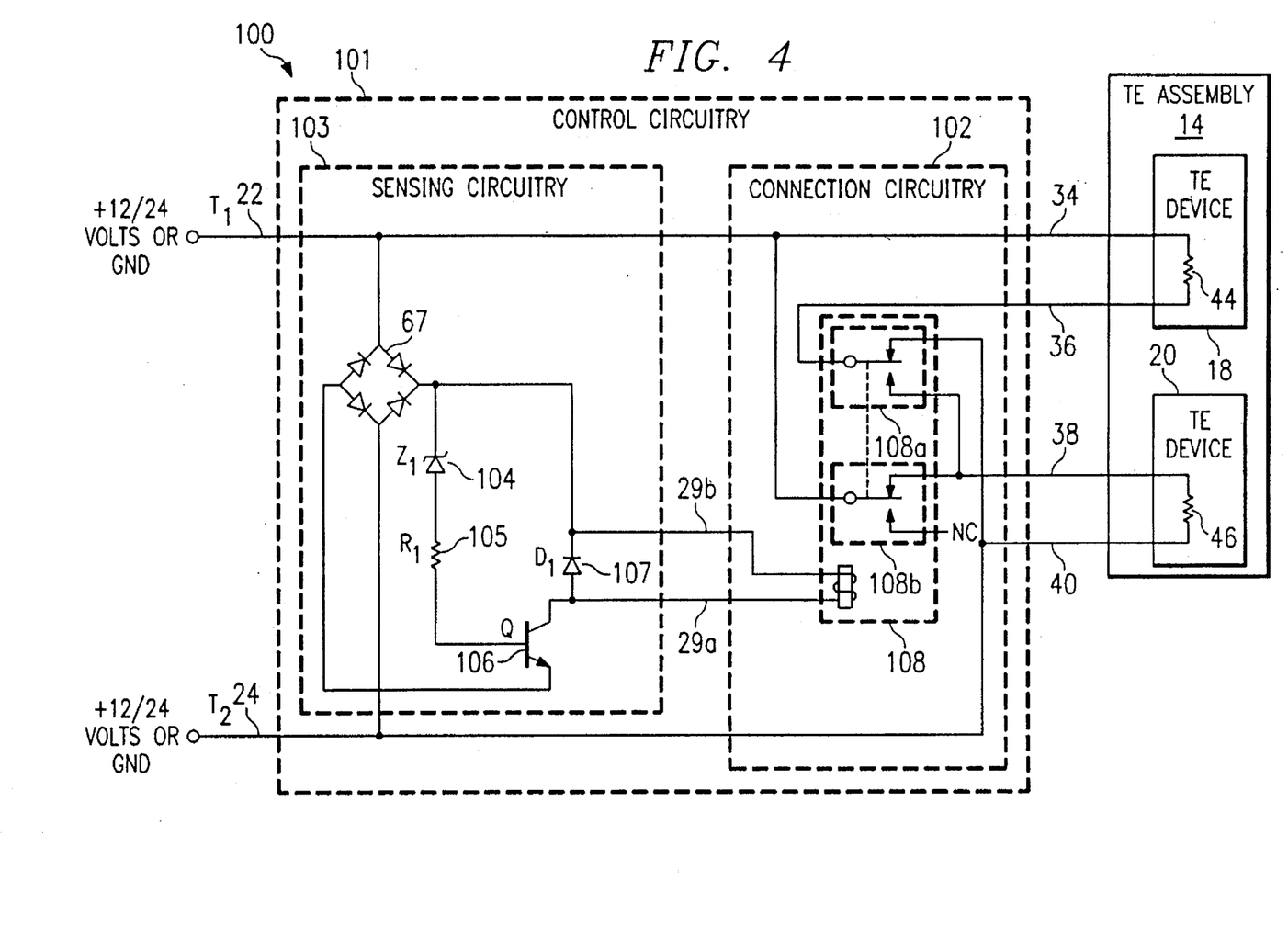
FIG. 4 depicts a circuit schematic for a thermoelectric apparatus incorporating another embodiment of the present invention having bipolar power source sensing circuitry.

FIG. 4 shows a schematic for another embodiment of the present invention. Thermoelectric apparatus 100 of FIG. 4 includes thermoelectric assembly 14 coupled to control circuitry 101 by leads 34, 36, 38 and 40. Connection circuitry 102 of control circuitry 101 is coupled to sensing circuitry 103 that is coupled to power source 12 (not explicitly shown) represented by $T_1$ 22 and $T_2$ 24. Sensing circuitry 103 includes rectifier bridge 67 coupled across $T_1$ 22 and $T_2$ 24 making sensing circuitry 103 bipolar. Sensing circuitry 103 also includes zener diode $Z_1$ 104 coupled in series with resistor $R_1$ 105 and to rectifier bridge 67. Sensing circuitry 103 also includes switch Q 106 and diode $D_1$ 107.

Switch Q 106 may be embodied in a bipolar transistor, and for the remaining discussions of sensing circuitry 103, switch Q 106 will be referred to as transistor Q 106. The base of transistor Q 106 is coupled to the anode of $Z_1$ 104 through $R_1$ 105. The emitter of transistor Q 106 is coupled to rectifier bridge 67, and the collector of transistor Q 106 is coupled to the anode of diode $D_1$ 107, and also provides control signal 29a from sensing circuitry 103. The cathode of diode $D_1$ 107 is coupled to rectifier bridge 67, the cathode of $Z_1$ 104, and provides control signal 29b from sensing circuitry 103. The value of $Z_1$ 104 in sensing circuitry 103 is chosen to conduct at the voltage level where thermoelectric assembly 14 should be switched from parallel to serial electrical configuration.

Connection circuitry 102 of FIG. 4 is embodied in a single pole, double throw switch 108. Connection circuitry 28 of FIG. 4 shows an embodiment where solid state components, such as MOSFETS A, B, C and D from FIG. 3, can be replaced with mechanical switch 108.

In operation of thermoelectric apparatus 100 of FIG. 4, when power source 12 provides a voltage across either $T_1$ 22 or $T_2$ 24 that is below the rating of $Z_1$ 102, then transistor Q 106 is off. This leaves switch 108 in the position shown in FIG. 4. For example, with $Z_1$ 102 rated at above 12 volts and with +12 volts supplied to $T_1$ 22, current is conducted through thermoelectric device 18, through coupling 108a of switch 108 to $T_2$ 24. Additionally, when +12 volts are supplied to $T_1$ 22, current is conducted across $T_1$ 22, through coupling 108b of switch 108, through thermoelectric device 20, and to $T_2$ 24. Reversing the polarity of the voltage on $T_1$ 22 and $T_2$ 24 does not affect the performance of thermoelectric apparatus 100.

Once the voltage on either $T_1$ 22 or $T_2$ 24 goes above the rating of $Z_1$ 104, it conducts causing transistor Q 106 to turn on. Turning transistor Q 106 on causes current to conduct in control signals 29a and 29b and energizes switch 108 to change the position of couplings 108a and 108b to their second position. With couplings 108a and 108b in their second position (the opposite position to that shown in FIG. 4), a serial path between thermoelectric devices 18 and 20 through switch 108 is established. Again, control circuitry 101 is not affected by whether $T_1$ 22 or $T_2$ 24 is the positive voltage. In this way, control circuitry 101 can sense the operating voltage supplied by the power source across $T_1$ 22 and $T_2$ 24 and electrically configure thermoelectric assembly 14 for operation with the power source.

Figure 5:
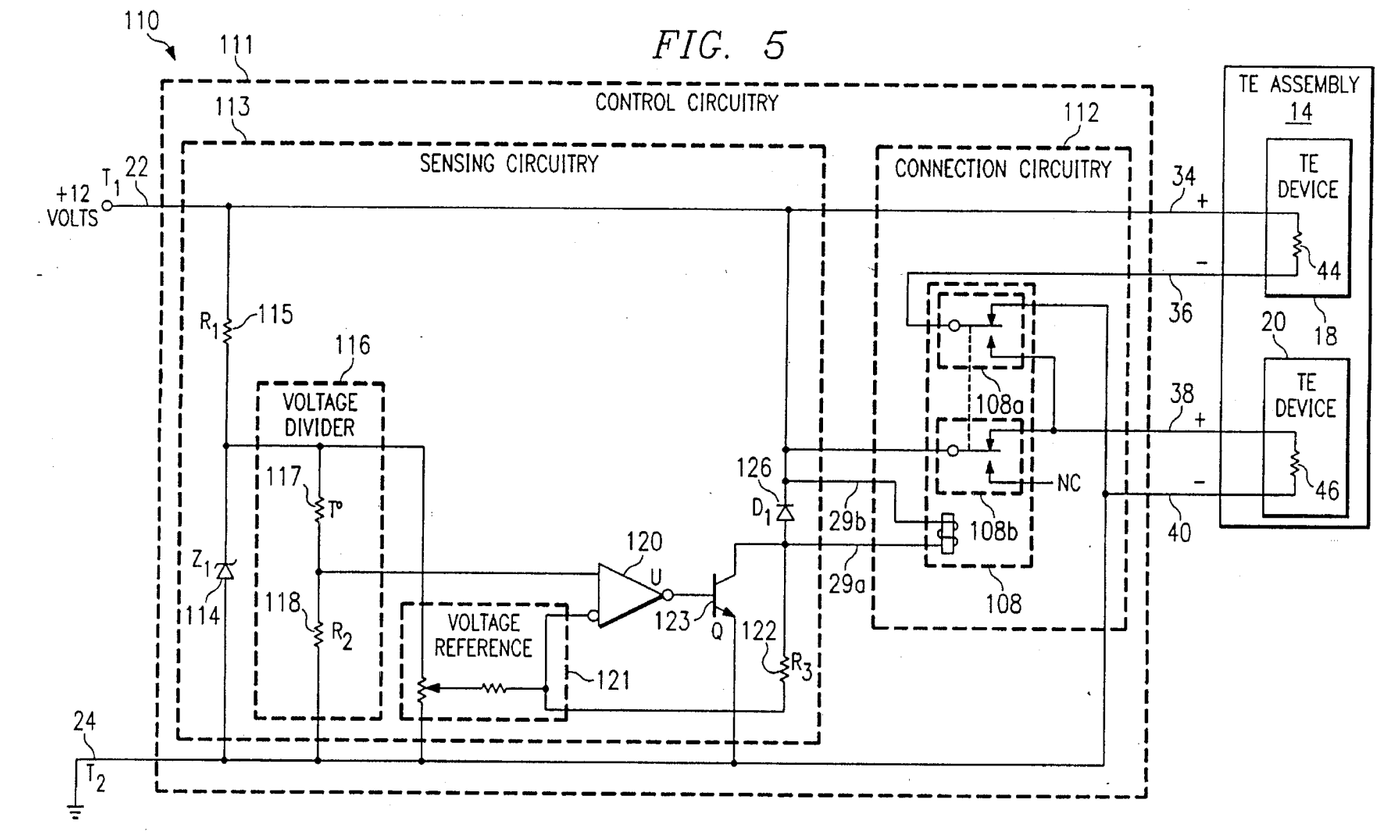
FIG. 5 illustrates a circuit schematic for a thermoelectric apparatus incorporating another embodiment of the present invention including temperature sensing and control circuitry.

FIG. 5 depicts another embodiment of the present invention including temperature sensing and control capability. Thermoelectric apparatus 110 includes thermoelectric assembly 14 coupled to control circuitry 111 by leads 34, 36, 38, and 40. Control circuitry 111 includes connection circuitry 112 and sensing circuitry 113. Control circuitry 111 is coupled to power source 12 providing a constant voltage (not explicitly shown) represented by $T_1$ 22 and $T_2$ 24. Connection circuitry 112 of thermoelectric apparatus 110 of FIG. 5 is similar to connection circuitry 102 of FIG. 4. Sensing circuitry 113 includes the ability to sense temperature so that thermoelectric assembly 14 may be temperature regulated when thermoelectric assembly 14 is provided with a constant 12 volts.

Sensing circuitry 113 includes zener diode $Z_1$ 114 coupled in series with resistor $R_1$ 115. This series combination is coupled across $T_1$ 22 and $T_2$ 24. Sensing circuitry 113 also includes voltage divider 116 including thermistor 117 and resistor $R_2$ 118. One end of voltage divider 116 is coupled between resistor $R_1$ 115 and zener diode $Z_1$ 114, and the other end is coupled to $T_2$ 24. Voltage divider 116 provides one of the inputs to comparator U 120. Voltage divider 116 may alternatively be a bimetallic thermal sensor, thermal couple, or solid state temperature sensor for measuring the temperature in apparatus 110.

Sensing circuitry 113 also includes voltage reference 121, which may be embodied in a voltage generating thermostat or other temperature setting device. One end of voltage reference 121 is coupled to voltage divider 116 and the other end has two outputs, with the first coupled to resistor $R_3$ 122 and the second providing the second input for comparator U 120. Comparator U 120 may be embodied in National Semiconductor part number LM311. The output of comparator U 120 is coupled to the base of switch Q 123 in sensing circuitry 113. Switch Q 123 may be embodied in a bipolar transistor, and switch Q 123 will be referred to as transistor Q 123 in the remaining discussions. The emitter of transistor Q 123 is coupled to $T_2$ 24, and the collector is coupled to $R_3$ 122, the anode of diode $D_1$ 126, and provides control signal 29a from sensing circuitry 26. Sensing circuitry 26 also provides control signals 29b from the cathode of diode $D_1$ 126. It is noted that thermoelectric apparatus 110 is preferred to be operated with a unipolar, single voltage power source 12 with the positive voltage provided on $T_1$ 22 and $T_2$ 24 grounded.

In operation of thermoelectric apparatus 110 of FIG. 5, the temperature to be maintained by thermoelectric assembly 14 is set by voltage reference 121. This may be a thermostat or other voltage setting device. Voltage reference 121 provides the first input to comparator U 120. Voltage divider 116 of sensing 113 senses the temperature of thermoelectric apparatus 110 with thermistor 117. Changing the temperature of thermistor 117 causes its value to change, and also the voltage provided by voltage divider 117 to the other input of comparator U 120. Comparator U 120 uses these two voltages to turn transistor Q 123 on or off. Leaving transistor Q 123 off maintains couplings 108a and 108b of switch 108 in connection circuitry 112 in the position shown in FIG. 5. This maintains thermoelectric devices 18 and 20 in a parallel electrical configuration and allows thermoelectric assembly 14 to provide full cooling or heating depending on the direction of current flow in thermoelectric devices 18 and 20.

Once the temperature of thermoelectric apparatus 110 reaches the desired low temperature when cooling or the desired high temperature when heating as measured by thermistor 117, the differences between the two voltages provided to comparator U 120 causes comparator U 120 to turn transistor Q 123 on. It is noted that programming hysteresis into comparator U 120 may be desirable to prevent connection circuitry 112 from oscillating between parallel and serial electrical configurations for thermoelectric devices 18 and 20. Turning transistor Q 123 on causes control signals 29a and 29b to energize switch 108 so that couplings 108a and 108b change their position to that shown in FIG. 5. Changing the position of couplings 108a and 108b connects thermoelectric devices 18 and 20 in a serial electrical configuration through switch 108. With the thermoelectric devices in a serial electrical configuration, a larger effective load is provided to constant power source 12 and, therefore, diminishes the heating or cooling capability of thermoelectric assembly 14.

By this way, temperature control of thermoelectric assembly 14 can be achieved. Rather than turning thermoelectric assembly 14 on and off, as was one previous method for temperature regulation, temperature regulating thermoelectric assembly 14 can be achieved by switching the electrical configuration of thermoelectric devices 18 and 20 between parallel and serial electrical configuration. This provides a technical advantage of eliminating temperature cycling of the individual components within thermoelectric assembly 14 that can cause damaging thermally-induced mechanical stresses. It is noted that connection circuitry 112 of FIG. 5 can be replaced with connection circuitry 48 of FIG. 2 or connection circuitry 75 of FIG. 3 without departing from inventive concepts of the present invention.

Figure 6:
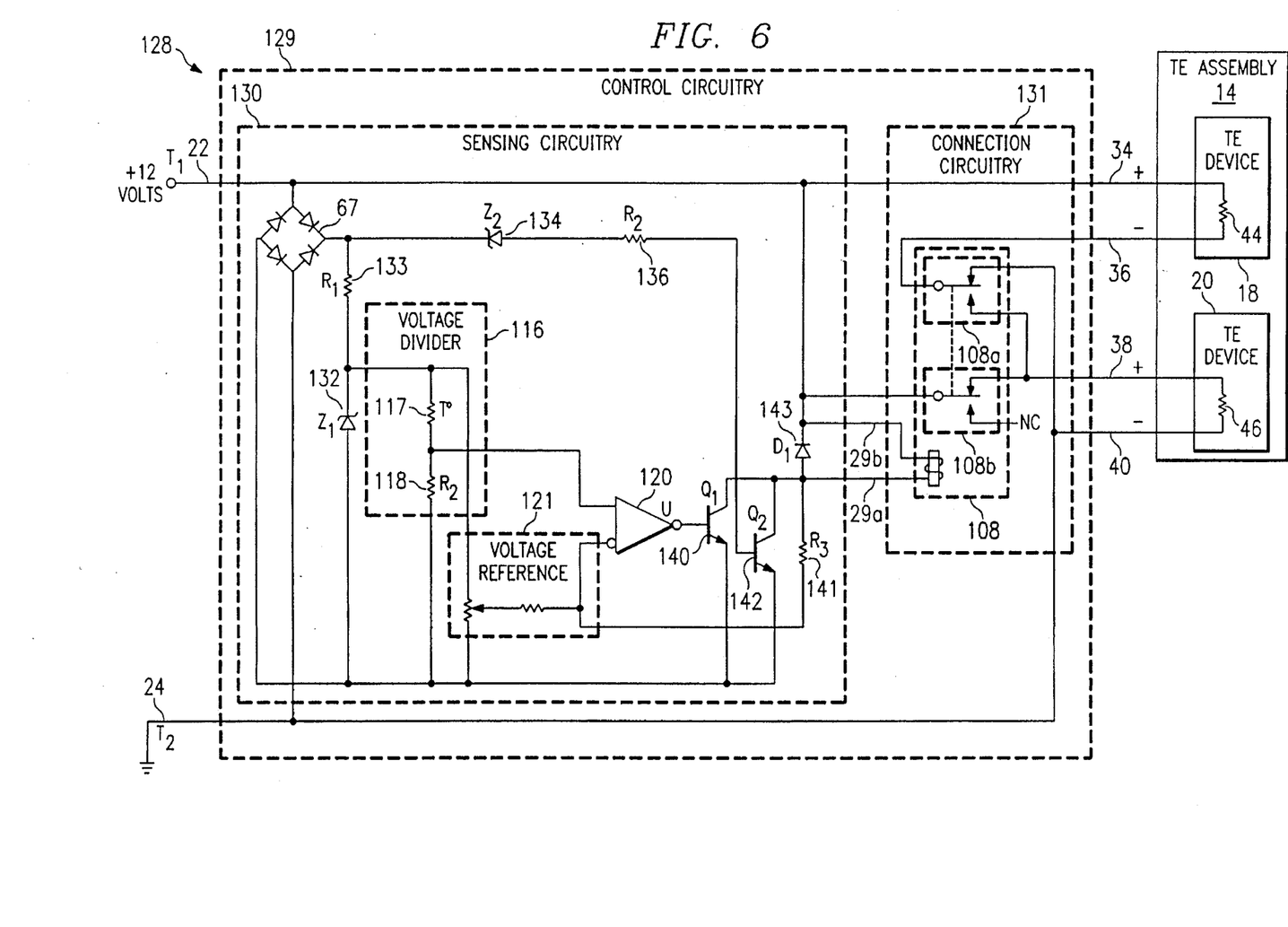
FIG. 6 shows a circuit schematic for a thermoelectric apparatus incorporating an embodiment of the present invention having a bipolar supply voltage and temperature sensing circuitry.

FIG. 6 illustrates another embodiment of the present invention. Thermoelectric apparatus 128 of FIG. 6 includes thermoelectric assembly 14 coupled to control circuitry 129 by leads 34, 36, 38 and 40. Control circuitry 129 includes sensing circuitry 130 and connection circuitry 131. Connection circuitry 131 includes switch 108 from FIG. 5. Sensing circuitry 130 includes rectifier bridge 67 to accommodate the positive voltage from power source 12 on either $T_1$ 22 or $T_2$ 24. Sensing circuitry 130 includes zener diode $Z_1$ 132 coupled in series with resistor $R_1$ 133 across the outputs of rectifier bridge 67. Sensing circuitry 130 also includes the serial combination of zener diode $Z_2$ 134 and $R_2$ 136 coupled to rectifier bridge 67 and to the base of switch $Q_2$ 142. Switch $Q_2$ 142 may be embodied in a bipolar transistor, and switch $Q_2$ 142 will be referred to as transistor $Q_2$ 142 hereinafter. Zener diode $Z_2$ 134 conducts when the voltage from rectifier bridge 67 exceeds the rating of $Z_2$ 134. Sensing circuitry 130 includes voltage divider 116 and voltage reference 121 from sensing circuitry 113 of FIG. 5. Sensing circuitry 130 includes comparator U 120 that receives inputs from voltage divider 116 and voltage reference 121. Comparator U 120 provides an output signal to switch $Q_1$ 140. Based on the difference between the inputs from voltage divider 116 and voltage reference 121, comparator U 120 turns switch $Q_1$ 140 on and off. Switch $Q_1$ 140 may be embodied in a transistor, and switch $Q_1$ 140 will be referred to as transistor $Q_1$ 140 hereinafter. The emitter of transistor $Q_1$ 140 is coupled to rectifier bridge 67, and the collector is coupled to the collector of transistor $Q_2$ 142 and the anode of diode $D_1$ 143, and provides control signal 29a to connection circuitry 131. The emitter of transistor $Q_2$ 142 is coupled to rectifier bridge 67. Sensing circuitry 130 also includes resistor $R_3$ 141 coupled to the anode of diode $D_1$ 143 and to one of the outputs of voltage reference 118. The cathode of diode $D_1$ 143 is coupled to resistor $R_2$ 136 and provides control signal 29b from sensing circuitry 26.

In operation of thermoelectric apparatus 128 of FIG. 6, when the voltage across $T_1$ 22 or $T_2$ 24 is below the rating of zener diode $Z_2$ 134, then the base of transistor $Q_2$ 142 is low and transistor $Q_2$ 142 is off. With transistor $Q_2$ 142 off, switch 108 is in the position shown in FIG. 6 with thermoelectric devices 18 and 20 in parallel electrical configuration. When the voltage across $T_1$ 22 or $T_2$ 24 goes above the rating for zener diode $Z_2$ 134, then zener diode $Z_2$ 134 turns on and conducts turning transistor $Q_2$ 142 on. Turning $Q_2$ 142 on causes control signals 29a and 29b to energize switch 108 so that couplings 108a and 108b change position to that shown in FIG. 6, putting thermoelectric devices 18 and 20 in serial electrical configuration.

Thermoelectric apparatus 128 of FIG. 6 also has temperature sensitivity and control when operating with a 12 volt power source. With +12 volts provided across $T_1$ 22 and $T_2$ 24, grounded voltage divider 116 provides an input to comparator U 120. The other input to comparator U 120 is provided by voltage reference 121 set to the desired temperature by adjusting the voltage from voltage reference 121. Comparator U 120 compares the two input voltages and controls transistor $Q_1$ 140 accordingly.

Turning on transistor $Q_1$ 140 changes the positions of couplings 108a and 108b as previously described so that thermoelectric devices 18 and 20 are in serial connection and provide less than full cooling or heating. Therefore, when control circuitry 16 has electrically configured thermoelectric devices 18 and 20 for parallel operation with a 12 volt power source, the electrical configuration of thermoelectric devices 18 and 20 may be switched to serial electrical configuration so that thermoelectric assembly 14 draws less current. As previously described, when thermoelectric devices 18 and 20 draw less current they also provide less heating or cooling. Switching between parallel and serial electrical configuration of thermoelectric devices 18 and 20 achieves temperature regulation of thermoelectric assembly 14.

Once the temperature drifts from a preset value, thermoelectric devices 18 and 20 can be switched back to parallel electrical configuration by control circuitry 130 so that thermoelectric assembly 14 provides full cooling or heating. Thermoelectric apparatus 128, therefore, provides technical advantages of compatibility with both 24 volt and 12 volt operating voltages and also temperature regulation of the thermoelectric assembly.

Figure 7:
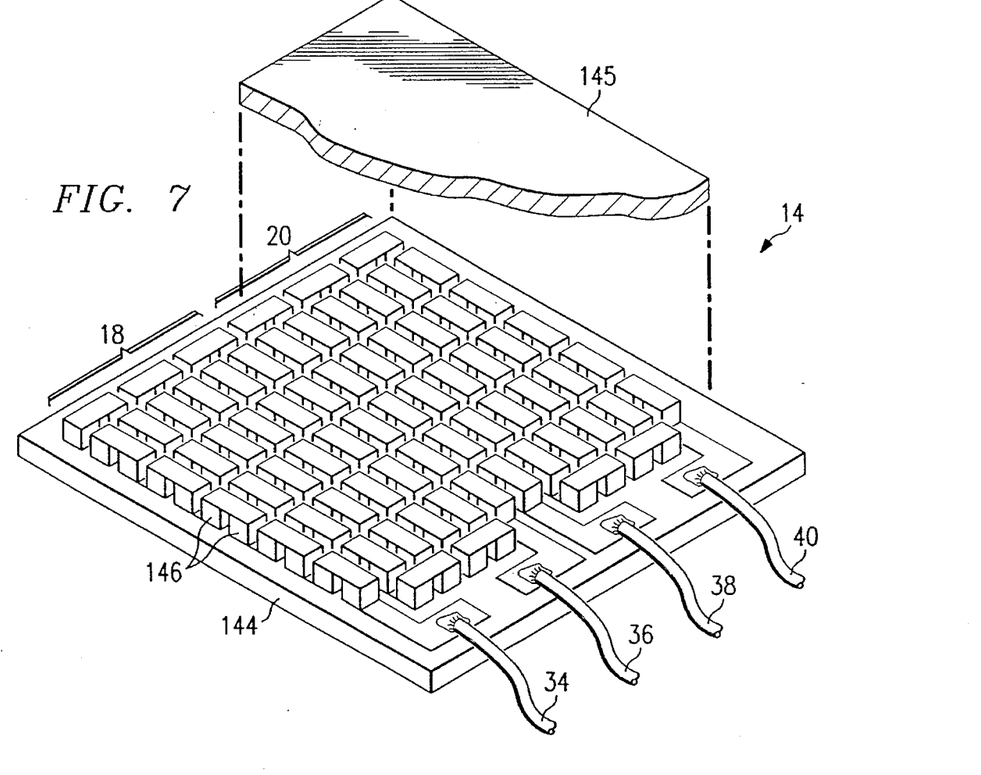
FIG. 7 shows a perspective view with portions broken away showing a thermoelectric assembly with one embodiment of the present invention.

FIG. 7 shows a perspective view of thermoelectric assembly 14. Thermoelectric assembly 14 includes heat transfer plates 144 and 145 with thermoelectric elements 146 disposed between heat transfer plates 144 and 145. Heat transfer plate 145 in FIG. 7 is shown in portion and in elevation so that the arrangement of thermoelectric elements 146 can be seen. Thermoelectric elements 146 are in a serial electrical connection and a parallel thermal connection between heat transfer plates 144. Thermoelectric assembly 14 is divided into two thermoelectric devices 18 and 20. In some embodiments of thermoelectric assembly 14, heat transfer plate 145 will be two separate plates divided at the interface between thermoelectric devices 18 and 20. Thermoelectric device 18 is supplied by leads 34 and 36, and thermoelectric device 20 is supplied by lead 38 and 40. The number of thermoelectric elements 146 in thermoelectric assembly 14 may be varied to achieve the desired power rating for thermoelectric assembly 14.

Figure 8:
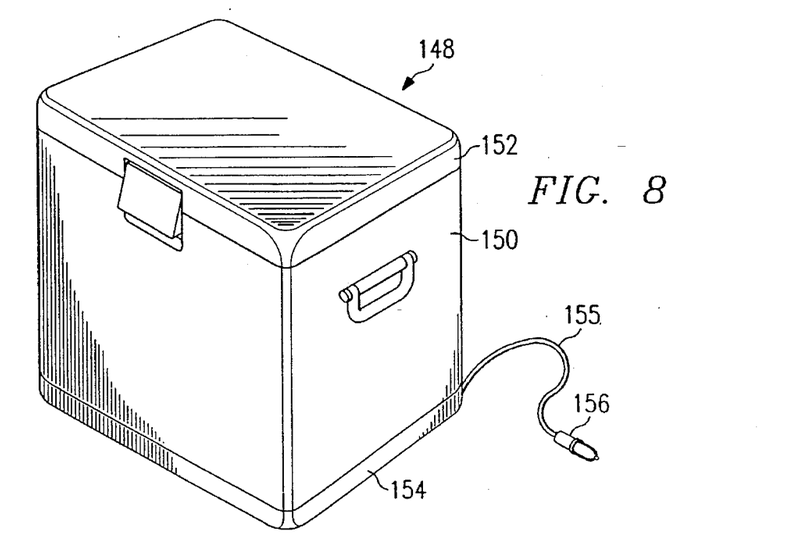
FIG. 8 illustrates a perspective view of a thermoelectric device embodying the present invention for cooling and heating.

FIG. 8 shows an embodiment of the present invention in cooling and heating device 148. Device 148 includes insulated container 150 and lid 152. Heating and cooling are provided to device 148 by thermoelectric system 154. Thermoelectric system 154 may be embodied in any of the thermoelectric systems previously described. Power is provided to system 154 by power cord 155 and coupler 156. Coupler 156 may be embodied in a commercially available cigarette lighter attachment. Device 148 of FIG. 8, including the embodiments of the present invention, may be used in vehicles with various power sources as has been previously described in detail. Device 148 may also include the temperature control and power control features of the present invention.

In operation of the present invention, control circuitry automatically senses the operating voltage from a power source and electrically configures the thermoelectric devices within a thermoelectric assembly to the appropriate parallel or serial electrical configuration. For lower operating voltages, the thermoelectric devices are coupled in parallel, and for higher operating voltages, the thermoelectric devices are electrically configured in series. The present invention can switch the thermoelectric devices between serial and parallel electrical configuration automatically.

The present invention provides technical advantages of a single thermoelectric assembly which can be used with numerous operating voltages. It also provides temperature control for the thermoelectric device to increase its efficiency and reliability.

Although the invention has been described in detail, it should be understood that various changes, substitutions, and alterations can be made hereto without departing from the spirit and scope of the invention defined by the appended claims.

What is claimed is:

1. A thermoelectric apparatus compatible with multiple power sources, each source providing a different voltage, the apparatus comprising:

a thermoelectric assembly having a plurality of thermoelectric devices; and control circuitry coupled between the thermoelectric assembly and a power source providing a voltage, the control circuitry operable to sense the voltage provided by the power source and to electrically configure the thermoelectric devices in the thermoelectric assembly between parallel and serial electrical configuration in response to the sensed voltage from the power source and to couple the thermoelectric devices to the power source.

2. The apparatus of claim 1 further comprising a temperature sensor operable to measure a temperature in the thermoelectric apparatus, and wherein the control circuitry is further operable to electrically configure the thermoelectric devices in the thermoelectric assembly between parallel and serial electrical configuration responsive to the measured temperature in order to achieve temperature regulation with the thermoelectric apparatus.

3. The apparatus of claim 1 wherein the control circuitry further comprises:

sensing circuitry coupled to the power source and operable to sense the voltage provided by the power source and to provide a control signal responsive to the sensed voltage from the power source; and connection circuitry responsive to the control signal operable to electrically configure the thermoelectric devices between parallel and serial electrical configuration responsive to the control signal and to couple the thermoelectric devices to the power source.

4. The apparatus of claim 3 wherein the connection circuitry further comprises:

parallel connection circuitry responsive to the control signal operable to couple the thermoelectric devices in parallel to the power source; and serial connection circuitry responsive to the control signal operable to couple the thermoelectric devices in series to the power source.

5. The apparatus of claim 3 wherein the sensing circuitry further comprises a bridge rectifier making the sensing circuitry bipolar with respect to the power source.

6. The apparatus of claim 3 wherein the sensing circuitry further comprises:

a temperature sensor operable to measure a temperature in the thermoelectric apparatus and to provide a measured temperature signal;

temperature setting circuitry operable to set the thermoelectric apparatus to a desired temperature and to provide a temperature setting signal; and a comparator operable to compare the measured temperature signal and the temperature setting signal and to provide the control signal so that the connection circuitry switches the thermoelectric devices between parallel and serial electrical configuration in response to the control signal in order to maintain the thermoelectric apparatus at the desired temperature.

7. The apparatus of claim 3 wherein the connection circuitry further comprises a single-pull, double-throw switch responsive to the control signal operable to electrically configure the thermoelectric devices between parallel and serial electrical configuration and to couple the thermoelectric devices to the power source.

8. The apparatus of claim 4 wherein the parallel connection circuitry further comprises a pair of switches responsive to the control signal operable to couple the thermoelectric devices in parallel to the power source.

9. The apparatus of claim 8 wherein each of the pair of switches further comprises a MOSFET.

10. The apparatus of claim 4 wherein the serial connection circuitry further comprises a diode operable to couple the thermoelectric devices in series.

11. The apparatus of claim 4 wherein the parallel connection circuitry further comprises a first pair of switches responsive to the control signal operable to couple the thermoelectric devices in parallel to the power source in a first polarity and a second pair of switches responsive to the control signal operable to couple the thermoelectric devices in parallel to the power source in a second polarity.

12. The apparatus of claim 11 wherein each of the first and second pair of switches further comprises a MOSFET.

13. The apparatus of claim 4 wherein the serial connection circuitry further comprises a first switch operable to couple the thermoelectric devices in series to the power source in a first polarity and a second switch operable to couple the thermoelectric devices in series to the power source in a second polarity.

14. The apparatus of claim 13 wherein each of the first and second switches further comprises a MOSFET.

15. A thermoelectric apparatus compatible with both 12 volt and 24 volt power sources, the apparatus comprising:

a thermoelectric assembly having first and second thermoelectric devices; and control circuitry coupled between the thermoelectric assembly and the power source, the control circuitry is operable to sense whether the power source provides 12 volts or 24 volts and to electrically configure the thermoelectric devices in the thermoelectric assembly in parallel when the power source provides 12 volts and to couple the thermoelectric devices in parallel to the power source and to electrically configure the thermoelectric devices in the thermoelectric assembly in series when the power source provides 24 volts and to couple the thermoelectric devices in series to the power source.

16. The apparatus of claim 15 wherein the control circuitry further comprises:

sensing circuitry coupled to the power source and operable to sense whether the power source provides 12 volts or 24 volts and to provide a control signal responsive to the sensed voltage of the power source;

connection circuitry responsive to the control signal operable to electrically configure the thermoelectric devices in the thermoelectric assembly in parallel when the power source provides 12 volts and to couple the thermoelectric devices in parallel to the power source and to electrically configure the thermoelectric devices in the thermoelectric assembly in series when the power source provides 24 volts and to couple the thermoelectric devices in series to the power source.

17. The apparatus of claim 16 wherein the connection circuitry further comprises:

parallel connection circuitry responsive to the control signal operable to couple the thermoelectric devices in parallel to the power source when the power source provides 12 volts; and serial connection circuitry responsive to the control signal operable to couple the thermoelectric devices in series to the power source when the power source provides 24 volts.

18. The apparatus of claim 16 wherein the sensing circuitry further comprises a bridge rectifier making the sensing circuitry bipolar with respect to the power source.

19. The apparatus of claim 16 wherein the sensing circuitry further comprises:

a temperature sensor operable to measure a temperature in the thermoelectric apparatus and to provide a measured temperature signal;

temperature setting circuitry operable to set the thermoelectric apparatus to a desired temperature and to provide a temperature setting signal; and a comparator operable to compare the measured temperature signal and the temperature setting signal and to provide a temperature control signal so that the connection circuitry switches the thermoelectric devices between parallel and serial electrical configuration responsive to the temperature control signal in order to maintain the thermoelectric apparatus at the desired temperature.

20. The apparatus of claim 16 wherein the connection circuitry further comprises a single-pull, double-throw switch responsive to the control signal operable to electrically configure the thermoelectric devices between parallel and serial electrical configuration and to couple the thermoelectric devices to the power source.

21. The apparatus of claim 17 wherein the parallel connection circuitry further comprises a pair of switches responsive to the control signal operable to couple the thermoelectric devices in parallel to the power source.

22. The apparatus of claim 21 wherein each of the pair of switches further comprises a MOSFET.

23. The apparatus of claim 17 wherein the serial connection circuitry further comprises a diode operable to couple the thermoelectric devices in series when the power source provides 24 volts.

24. The apparatus of claim 17 wherein the parallel connection circuitry further comprises a first pair of switches responsive to the control signal operable to couple the thermoelectric devices in parallel to the power source in a first polarity and a second pair of switches responsive to the control signal operable to couple the thermoelectric devices in parallel to the power source in a second polarity.

25. The apparatus of claim 24 wherein each of the first and second pair of switches further comprises a MOSFET.

26. The apparatus of claim 17 wherein the serial connection circuitry further comprises a first switch operable to couple the thermoelectric devices in series to the power source in a first polarity and a second switch operable to couple the thermoelectric devices in series to the power source in a second polarity.

27. The apparatus of claim 26 wherein each of the first and second switches comprises a MOSFET.

28. A thermoelectric system compatible with multiple power sources for heating and cooling a load, each power source providing a different voltage, the device comprising:

a container for housing the load;

a thermoelectric assembly having a plurality of thermoelectric devices; and control circuitry coupled between the thermoelectric assembly and a power source providing a voltage, the control circuitry is operable to sense the voltage provided by the power source and to electrically configure the thermoelectric devices in the thermoelectric assembly between parallel and serial electrical configuration responsive to the sensed voltage from the power source and to couple the thermoelectric devices to the power source.

29. The system of claim 28 wherein the control circuitry further comprises:

sensing circuitry coupled to the power source and operable to sense the voltage provided by the power source and to provide a control signal responsive to the sensed voltage from the power source; and connection circuitry responsive to the control signal operable to electrically configure the thermoelectric devices between parallel and serial electrical configuration responsive to the control signal and to couple the thermoelectric devices to the power source.

30. The system of claim 29 wherein the connection circuitry further comprises:

parallel connection circuitry responsive to the control signal operable to couple the thermoelectric devices in parallel to the power source; and serial connection circuitry responsive to the control signal operable to couple the thermoelectric devices in series to the power source.

31. The system of claim 29 wherein the sensing circuitry further comprises a bridge rectifier making the sensing circuitry bipolar with respect to the power source.

32. The system of claim 29 wherein the sensing circuitry further comprises:

a temperature sensor operable to measure a temperature in the thermoelectric system and to provide a measured temperature signal;

temperature setting circuitry operable to set the thermoelectric system to a desired temperature and to provide a temperature setting signal; and a comparator operable to compare the measured temperature signal and the temperature setting signal and to provide the control signal so that the connection circuitry switches the thermoelectric devices between parallel and serial electrical configuration responsive to the control signal in order to maintain the thermoelectric system at the desired temperature.

* * * * *